United States Patent [19]
Tani et al.

[11] Patent Number: 5,210,709
[45] Date of Patent: May 11, 1993

[54] DIGITAL FILTER FOR REMOVING DC COMPONENTS

[75] Inventors: Yasunori Tani, Osaka; Tetsuhiko Kaneaki, Ashiya; Akira Sobajima, Osaka, all of Japan

[73] Assignee: Matsushita Electric Industrial Co., Ltd., Osaka, Japan

[21] Appl. No.: 875,176

[22] Filed: Apr. 28, 1992

[30] Foreign Application Priority Data

May 8, 1991 [JP] Japan ................... 3-102442

[51] Int. Cl.$^5$ ............................................ G06F 15/31
[52] U.S. Cl. ................................................ 364/724.03
[58] Field of Search ................. 364/724.03, 724.17

[56] References Cited

U.S. PATENT DOCUMENTS

| | | | |
|---|---|---|---|
| 3,982,112 | 9/1976 | Schlereth .................. | 364/724.03 |
| 3,997,770 | 12/1976 | Claasen et al. ............ | 364/724.03 |
| 4,034,196 | 7/1977 | Butterweck et al. ....... | 364/724.03 |
| 4,213,187 | 7/1980 | Lawrence et al. .......... | 364/724.03 |
| 4,215,415 | 7/1980 | Kanemasa et al. ......... | 364/724.03 |
| 4,236,224 | 11/1980 | Chang ....................... | 364/724.03 |
| 4,321,685 | 3/1982 | Kasupa et al. ............. | 364/724.03 |
| 4,569,030 | 2/1986 | Butterweck et al. ....... | 364/724.03 |
| 4,823,296 | 4/1989 | Millar ........................ | 364/724.03 |

FOREIGN PATENT DOCUMENTS 0196825 10/1986 European Pat. Off. .
1-4111 1/1989 Japan .
8502508 6/1985 PCT Int'l Appl. .

*Primary Examiner*—Tan V. Mai
*Attorney, Agent, or Firm*—Lowe, Price, LeBlanc & Becker

[57] ABSTRACT

An offset reducer includes an adder for adding an input signal and an offset cancel signal to reduce an offset component of the input signal. A converter serves to measure a difference between a sum of past periods during which an output signal of the adder was positive and a sum of past periods during which the output signal of the adder was negative. The converter outputs an offset detection signal of a given value which depends on a sign of the measured difference when an absolute value of the measured difference exceeds a given difference. The converter initializes the measured difference to a given initial difference when the offset detection signal is outputted. An integrator serves to accumulate the offset detection signal outputted from the converter. The integrator generates the offset cancel signal in accordance with a result of the accumulating the offset detection signal. The output signal of the adder constitutes an offset-free signal corresponding to the input signal.

2 Claims, 3 Drawing Sheets

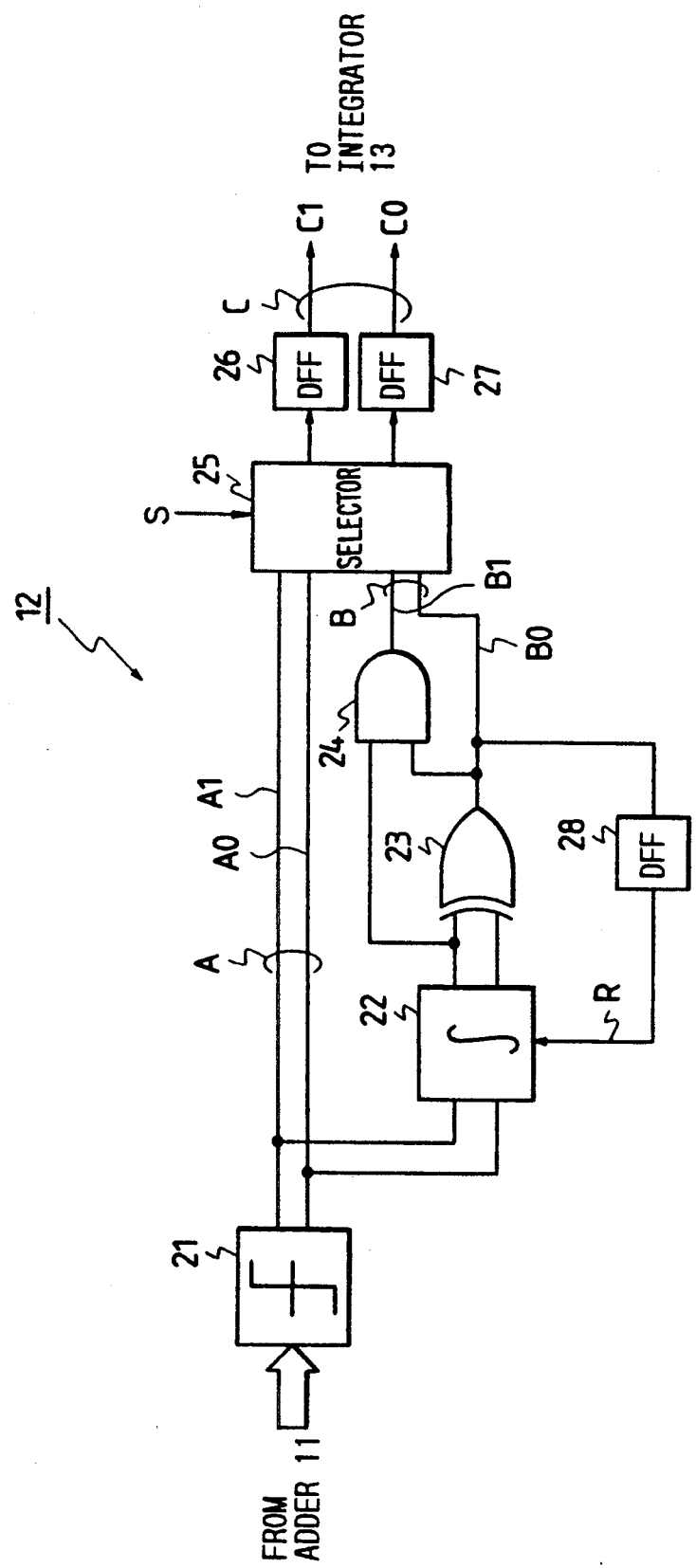

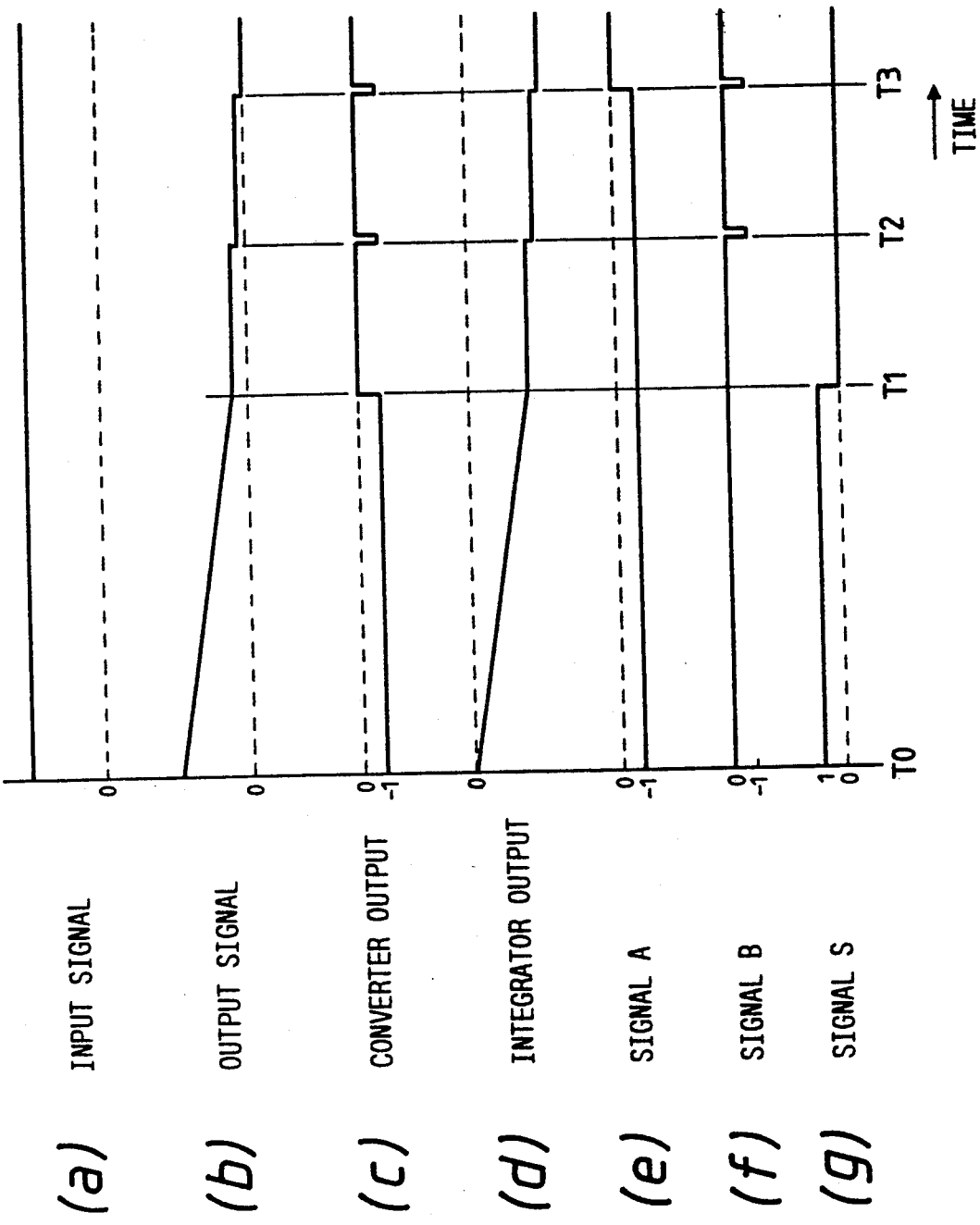

DIGITAL FILTER FOR REMOVING DC COMPONENTS

BACKGROUND OF THE INVENTION

This invention generally relates to an offset reducer. This invention specifically relates to a device for removing dc or offset components from a signal in a digital circuit.

Digital filters process digital signals and execute given calculations on the digital signals. In some of digital filters, the result of calculation is rounded down to a required number of bits by omitting bits lower than the required bits. Rounding down the calculation result causes a dc or offset component of a signal outputted from the digital filter. Generally, it is desirable to remove such an offset component from a signal.

Japanese published unexamined patent application 64-4111 discloses a digital filter circuit which serves as an offset reducer. Specifically, the prior art circuit of Japanese application 64-4111 includes a digital filter having a transfer function H(z) designed as follows.

$$H(z) = 1 - z^{-1} \quad (1)$$

This prior art digital filter has amplitude-frequency response characteristics expressed as follows.

$$A(z) = 2 \cdot |\sin(\theta/2)| \quad (2)$$

where A(z) denotes an amplitude, and $\theta$ denotes an angular frequency. As understood from the equation (2), the prior art digital filter is a low cut filter capable of removing dc components from an input signal.

In processing digital audio signals, low-frequency signal components are generally important for high fidelity. The prior art digital filter of Japanese application JP1-4111 tends to significantly reduce the levels of important low-frequency signal components.

SUMMARY OF THE INVENTION

It is an object of this invention to provide an improved offset reducer.

A first aspect of this invention provides an offset reducer comprising an adder for adding an input signal and an offset cancel signal to reduce an offset component of the input signal; a converter for measuring a difference between a sum of past periods during which an output signal of the adder was positive and a sum of past periods during which the output signal of the adder was negative, for outputting an offset detection signal of a given value which depends on a sign of the measured difference when an absolute value of the measured difference exceeds a given difference, and for initializing the measured difference to a given initial difference when the offset detection signal is outputted; and an integrator for accumulating the offset detection signal outputted from the converter, and for generating the offset cancel signal in accordance with a result of the accumulating the offset detection signal; wherein the output signal of the adder constitutes an offset-free signal corresponding to the input signal.

A second aspect of this invention provides an offset reducer comprising means for detecting whether or not an offset component is present in an input signal, and for generating an offset detection signal representative thereof; and means for correcting the input signal in accordance with the offset detection signal to remove an offset component from the input signal.

A third aspect of this invention provides an offset reducer comprising first means for combining an input signal and an offset cancel signal to reduce an offset component of the input signal; second means for detecting an offset component remaining in an output signal of the first means, and for generating an offset detection signal representative thereof; and third means for controlling the offset cancel signal in accordance with the offset detection signal.

BRIEF DESCRIPTION OF THE DRAWINGS

FIG. 2 is a block diagram of the converter of FIG. 1.

FIGS. 5(a)–(q) are a timing diagram showing the time-domain conditions of various signals in the offset reducer of FIG. 1.

DESCRIPTION OF THE PREFERRED EMBODIMENT

Figure 1:
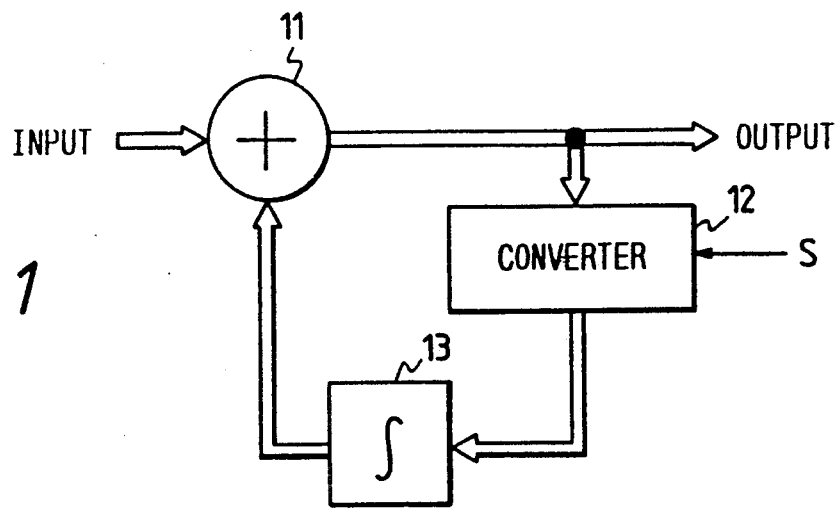
FIG. 1 is a block diagram of an offset reducer according to an embodiment of this invention.

With reference to FIG. 1, an offset reducer includes an adder 11, a converter 12, and an integrator 13.

An input digital signal has a predetermined sampling frequency. Thus, the state of the input signal or the value represented by the input signal changes at a period (a sampling period) which equals the reciprocal of the sampling frequency.

The input signal is fed to a first input terminal of the adder 11. A digital signal outputted from the integrator 13 is fed to a second input terminal of the adder 11. As will be made clear later, the output signal of the integrator 13 is an offset (dc component) cancel signal. The adder 11 adds the input signal and the offset cancel signal to remove an offset component (a dc component) from the input signal. The output signal of the adder 11 is fed to the converter 12. In addition, the output signal of the adder 11 is transmitted to an external device (not shown) as an output signal of the offset reducer which is substantially free from an offset component (a dc component).

The converter 12 accumulates "+1" and "−1" in accordance with the sign of the output signal of the adder 11. Specifically, the converter 12 accumulates "+1" when the value represented by the output signal of the adder 11 is positive. The converter 12 accumulates "−1" when the value represented by the output signal of the adder 11 is negative. In other words, the converter 12 accumulates "+1" during sampling periods for which the value represented by the output signal of the adder 11 is positive. The converter 12 accumulates "+1" during sampling periods for which the value represented by the output signal of the adder 11 is negative. In this way, the converter 12 calculates the difference in length between the sum of past sampling periods during which the value represented by the output signal of the adder 11 is positive and the sum of past sampling periods during which the value represented by the output signal of the adder 11 is negative. The converter 12 calculates the absolute value of the previously-mentioned time difference (period difference). The converter 12 compares the absolute value of the time difference with a predetermined reference value. When the absolute value of the time difference exceeds the reference value, an appreciable offset component is decided to be present in the output signal of the adder 11. When the absolute value of the time difference is equal to or smaller than the reference value, an appreciable offset component is decided to be absent from the output signal of the adder 11. In the case where the absolute value of the time difference exceeds the reference value, the converter 12 detects the sign of the time difference, that is, detects whether the time difference is positive or negative. When the converter 12 detects that the time difference is positive, an appreciable positive offset component is decided to be present in the output signal of the adder 11. When the converter 12 detects that the time difference is negative, an appreciable negative offset component is decided to be present in the output signal of the adder 11. In the case where an appreciable positive offset component is decided to be present in the output signal of the adder 11, when a 1-bit control signal S fed from a signal generator (not shown) is "0", the converter 12 outputs a signal representative of "−1" to the integrator 13 to cancel the positive offset component. In the case where an appreciable negative offset component is decided to be present in the output signal of the adder 11, when the control signal S is "0", the converter 12 outputs a signal representative of "+1" to the integrator 13 to cancel the negative offset component. Each time the converter 12 outputs a signal representative of "+1" or "−1", the converter 12 initializes the result of the accumulation to "0".

The integrator 13 accumulates the output signal of the converter 12 into an offset cancel signal. The integrator 13 outputs the offset cancel signal to the adder 11.

As shown in FIG. 2, the converter 12 includes a quantizer 21, an integrator 22, an Exclusive-OR gate 23, and AND gate 24, a selector 25, and D-type flip-flops 26, 27, and 28.

The converter 12 of FIG. 2 operates as follows. The quantizer 21 receives the output signal of the adder 11 (see FIG. 1). The quantizer 21 detects whether the value represented by the output signal of the adder 11 is positive, negative, or zero. In other words, the quantizer 21 detects the sign of the value represented by the output signal of the adder 11. The quantizer 21 generates a 2-bit signal A in accordance with the result of the detection of the sign of the value represented by the output signal of the adder 11. The quantizer 21 outputs the 2-bit signal A to the integrator 22 and the selector 25. The output signal A of the quantizer 21 has bits A1 and A0. The bit A1 is a sign bit. The bit A0 represents an absolute signal value. When the quantizer 21 detects that the value represented by the output signal of the adder 11 is positive, the output signal A of the quantizer 21 assumes a state of "−1". When the quantizer 21 detects that the value represented by the output signal of the adder 11 is negative, the output signal A of the quantizer 21 assumes a state of "+1". Thus, the output signal A of the quantizer 21 represents a digital value, the sign of which is opposite to the sign of the output signal of the adder 11, and the absolute value of which is equal to "1". When the quantizer 21 detects that the value represented by the output signal of the adder 11 is zero, the output signal A of the quantizer 21 assumes a state of "0". It should be noted that, as will be described later, when the quantizer 21 detects that the value represented by the output signal of the adder 11 is equal to a given value near zero, the output signal A of the quantizer 21 also assumes a state of "0".

The integrator 22 accumulates the output signal A of the quantizer 21, and generates a multi-bit signal representing the result of the accumulation. The integrator 22 selects and outputs two higher bits of the accumulation-result signal. The accumulation-result signal represents the difference in length between the sum of past sampling periods during which the value represented by the output signal of the adder 11 is positive and the sum of past sampling periods during which the value represented by the output signal of the adder 11 is negative.

The 2-bit output signal of the integrator 22 is processed by a combination of the Exclusive-OR gate 23 and the AND gate 24 into a signal B having bits B1 and B0. The bit B1 is a sign bit. The bit B0 represents an absolute signal value. Specifically, the two bits of the output signal of the integrator 22 are fed to input terminals of the Exclusive-OR gate 23 respectively. The higher bit (the sign bit) of the output signal of the integrator 22 is fed to a first input terminal of the AND gate 24. The output signal of the Exclusive-OR gate 23 is fed to a second input terminal of the AND gate 24. The output signal of the Exclusive-OR gate 23 corresponds to the bit B0. The output signal of the AND gate 24 corresponds to the bit B1. In the case where the absolute value of the result of the accumulation by the integrator 22 is equal to or smaller than a predetermined reference value so that both the logic states of the bits of the output signal of the integrator 22 are equal to each other and are "0" or "1", the signal bit B0 outputted from the Exclusive-OR gate 23 is "0" so that the signal bit B1 outputted from the AND gate 24 is also "0". Thus, in this case, both the signal bits B1 and B0 are "0", and the signal B is "00". On the other hand, in the case where the absolute value of the result of the accumulation by the integrator 22 is larger than the predetermined reference value so that the logic states of the bits of the output signal of the integrator 22 are different, the signal bit B0 outputted from the Exclusive-OR gate 23 is "1" so that the signal bit B1 outputted from the AND gate 24 is equal in logic level to the sign bit (the higher bit) of the output signal of the integrator 22. Specifically, when the output signal of the integrator 22 is "01", the signal B is "01", that is, "+1". When the output signal of the integrator 22 is "10", the signal B is "11", that is, "−1". Thus, only in the case where the absolute value of the result of the accumulation by the integrator 22 is larger than the predetermined reference value, the signal B represents a digital value, the sign of which is generally opposite to the sign of the output signal of the adder 11, and the absolute value of which is equal to "1". The flip-flop 28 outputs a reset signal R to the integrator 22 in response to the bit B0 in the logic state of "1", so that the value of the result of the accumulation in the integrator 22 is initialized to "0".

The selector 25 selects one of the signals A and B in accordance with the control signal S. Specifically, the selector 25 selects the signal A when the control signal S is "1". The selector 25 selects the signal B when the control signal S is "0". As described previously, the output signal A of the quantizer 21 represents a digital value, the sign of which is opposite to the sign of the output signal of the adder 11, and the absolute value of which is equal to "1". On the other hand, only in the case where the absolute value of the result of the accumulation by the integrator 22 is larger than the predetermined reference value, the signal B represents a digital value, the sign of which is generally opposite to the sign of the output signal of the adder 11, and the absolute value of which is equal to "1". The selector 25 outputs the higher bit and the lower bit of the selected signal to the flip-flops 26 and 27 respectively. The higher bit and the lower bit of the selected signal are transmitted through the flip-flops 26 and 27 to the integrator 13 (see FIG. 1) respectively. The higher bit and the lower bit of the selected signal are bits C1 and C0 which compose a signal C.

Figure 3:
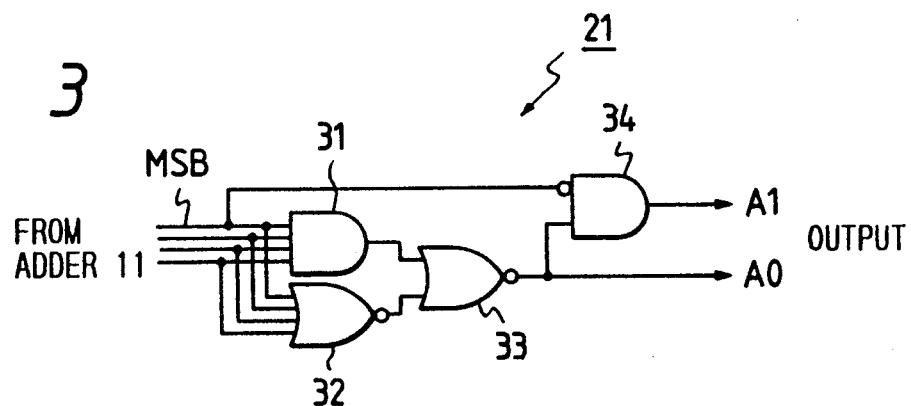
FIG. 3 is a block diagram of the quantizer of FIG. 2.

As shown in FIG. 3, the quantizer 21 includes a 4-input AND gate 31, a 4-input NOR gate 32, a 2-input NOR gate 33, and a 2-input AND gate 34. The AND gate 34 is of the special type, having an inverting input terminal and a non-inverting input terminal.

The quantizer 21 of FIG. 3 operates as follows. The output signal of the adder 11 (see FIG. 1) has four bits, being fed to the AND gate 31 and the NOR gate 32. When the output signal of the adder 11 is "0000" corresponding to a decimal number "0", the NOR gate 32 outputs a signal of "1" to a first input terminal of the NOR gate 33. Otherwise, the NOR gate 32 outputs a signal of "0" to the first input terminal of the NOR gate 33. When the output signal of the adder 11 is "1111" corresponding to a decimal number "−1", the AND gate 31 outputs a signal of "1" to a second input terminal of the NOR gate 33. Otherwise, the AND gate 31 outputs a signal of "0" to the second input terminal of the NOR gate 33. Thus, when the output signal of the adder 11 is "0000" or "1111", the NOR gate 33 outputs a signal A0 of "0" to the non-inverting input terminal of the AND gate 34. Otherwise, the NOR gate 33 outputs a signal A0 of "1" to the non-inverting input terminal of the AND gate 34. The inverting input terminal of the AND gate 34 receives the highest bit (the sign bit MSB) of the output signal of the adder 11. Thus, when the output signal of the adder 11 is "0000" or "1111", the AND gate 34 outputs a signal A1 of "0" and thus the signal A composed of the bits A1 and A0 are "00". Otherwise, the AND gate 34 outputs a signal A1 in a logic state equal to the inversion of the logic state of the sign bit of the output signal of the adder 11 while the signal A0 is "1". Thus, in the case where the output signal of the adder 11 is different from "0000" and "1111", when the value represented by the output signal of the adder 11 is positive, the signal A is "11", that is, "−1". In the same case, when the value represented by the output signal of the adder 11 is negative, the signal A is "01", that is, "+1".

Figure 4:
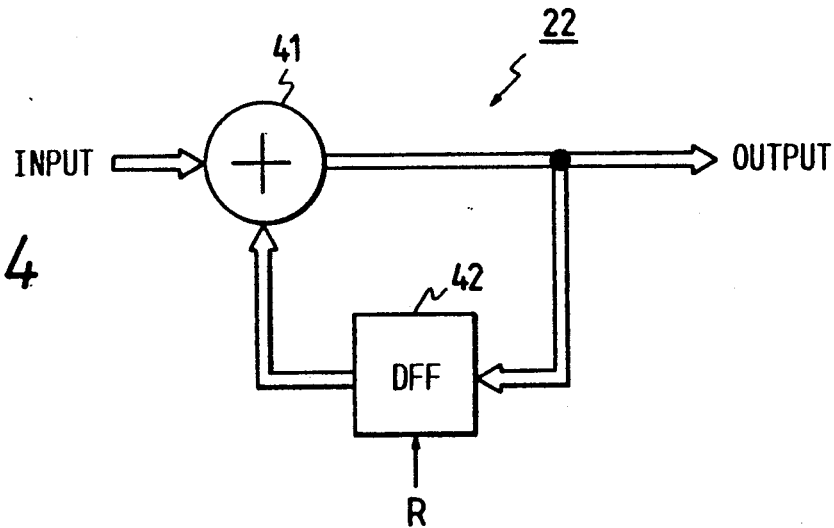
FIG. 4 is a block diagram of the integrator of FIG. 2.

As shown in FIG. 4, the integrator 22 includes an adder 41 and a D-type flip-flop 42.

The integrator 22 of FIG. 4 operates as follows. A first input terminal of the adder 41 receives the output signal of the quantizer 21 (see FIG. 2). A second input terminal of the adder 41 receives the output signal of the flip-flop 42. The adder 41 adds the output signal of the quantizer 21 and the output signal of the flip-flop 42. The adder 41 outputs a signal representative of the result of the addition between the output signal of the quantizer 21 and the output signal of the flip-flop 42. The output signal of the adder 41 is latched by the flip-flop 42, and is then fed back to the adder 41 via the flip-flop 42 so that the output signal of the quantizer 21 is integrated or accumulated. The output signal of the adder 41 which represents the result of the accumulation has three or more bits. Only the two higher bits of the output signal of the adder 41 are fed to the later stage including the combination of the Exclusive-OR gate 23 and the AND gate 24 (see FIG. 2). The flip-flop 42 is reset by the reset signal from the flip-flop 28 (see FIG. 2). When the flip-flop 42 is reset, the signal held by the flip-flop 42 is initialized to a state corresponding to "0".

The integrator 13 is similar in internal design to the integrator 22 of FIG. 4 except that all the bits of an output signal of an adder 41 are fed to the adder 11 (see FIG. 1).

The operation of the offset reducer of FIG. 1 will be further described hereinafter with reference to FIG. 5. The portions (a) and (b) of FIG. 5 show examples of the time-domain conditions of the input signal to and the output signal from the offset reducer of FIG. 1 respectively. The output signal from the offset reducer is equal to the output signal of the adder 11 of FIG. 1. The portions (c) and (d) of FIG. 5 show examples of the time-domain conditions of the output signals of the converter 12 and the integrator 13 of FIG. 1 respectively. The portions (e), (f), and (g) of FIG. 5 show examples of the time-domain conditions of the signals A, B, and S of FIG. 2 respectively.

It is now assumed that, as shown in the portion (a) of FIG. 5, the input signal to the offset reducer is a positive constant dc signal. In addition, it is assumed that, as shown in the portion (g) of FIG. 5, the control signal S remains "1" during the period between moments T0 and T1 and changes to "0" at the moment T1, and then remains "0".

During the period between the moments T0 and T1, the output signal of the adder 11 is positive and the control signal S is "1" so that the output signal of the converter 12 remains "−1" as shown in the portion (c) of FIG. 5. In addition, the signal A remains "−1" as shown in the portion (e) of FIG. 5. Since the control signal S is "1", the signal A is selected by the selector 25 of FIG. 2 and is then outputted from the converter 12. The output signal of the converter 12 is accumulated by the integrator 13 so that the value represented by the output signal of the integrator 13 decreases at a constant rate as shown in the portion (d) of FIG. 5. Since the input signal to the offset reducer and the output signal of the integrator 13 are added by the adder 11, the output signal from the offset reducer (the output signal of the adder 11) decreases toward "0" at a constant rate as shown in the portion (b) of FIG. 5. At the moment T1, the value represented by the output signal from the offset reducer reaches "+2".

During the period between the moment T1 and a moment T2, the signal B remains "0" as shown in the portion (f) of FIG. 5. In addition, since the control signal S is "0" as shown in the portion (g) of FIG. 5, the signal B is selected by the selector 25 of FIG. 2 and is then outputted from the converter 12. The output signal of the converter 12 remains "0" and thus the output signal of the integrator 13 remains constant as shown in the portions (c) and (d) of FIG. 5. Since the output signal of the integrator 13 remains constant, the output signal from the offset reducer (the output signal of the adder 11) continues to be "+2" as shown in the portion (b) of FIG. 5. At the moment T2 which follows the moment T1 by a given period, the signal B is changed by the operation of the integrator 22 of FIG. 2 to "−1" as shown in the portion (g) of FIG. 5. The change of the signal B to "−1" causes the output signal of the integrator 13 to decrease by "1" as shown in the portion (d) of FIG. 5, so that the output signal from the offset reducer decreases from "+2" to "+1" as shown in the portion (b) of FIG. 5. Immediately after the moment T2, the integrator 22 of FIG. 2 is reset so that the signal B and the output signal of the converter 12 return to "0" as shown in the portions (f) and (c) of FIG. 5.

During the period between the moment T2 and a moment T3, since the control signal S is "0" as shown in the portion (g) of FIG. 5, the signal B is selected by the selector 25 of FIG. 2 and is then outputted from the converter 12. During this period, the output signal from the offset reduce (the output signal of the adder 11) continues to be "+1" as shown in the portion (b) of FIG. 5. AT the moment T3 which follows the moment T2 by a given period, the signal B is changed by the operation of the integrator 22 of FIG. 2 to "−1" as shown in the portion (g) of FIG. 5. The change of the signal B to "−1" causes the output signal of the integrator 13 to decrease by "1" as shown in the portion (d) of FIG. 5, so that the output signal from the offset reducer decreases from "+1" to "0" as shown in the portion (b) of FIG. 5. In this way, the offset component is completely removed. At the moment T3, the signal A changes to "0" as shown in the portion (e) of FIG. 5. Immediately after the moment T3, the integrator 22 of FIG. 2 is reset so that the signal B and the output signal of the converter 12 return to "0" as shown in the portions (f) and (c) of FIG. 5. After the moment T3, the output signal from the offset reducer (the output signal of the adder 11) continues to be "0" as shown in the portion (b) of FIG. 5.

In cases where the input signal to the offset reducer has a negative constant dc component (offset component), the offset component is removed by processes similar to the previously-mentioned processes.

As understood from the slope of the line and the size of the steps between the lines of the portion (b) of FIG. 5, an offset component is decreased at a higher rate and a lower rate when the control signal S is "1" and "0" respectively. In other words, the node of operation of the offset reducer is changed between a quick type and a slow type in response to the control signal S. The quick mode of operation is selected when the control signal S is "1". The slow mode of operation is selected when the control signal S is "0". During the quick mode of operation, an offset component can be decreased at a higher rate. During the slow mode of operation, an offset component can be decreased at a lower rate while the removal of the offset component can be executed completely and reliably.

In summary, during the slow mode of operation, the converter 12 decides or detects whether or not an appreciable offset component remains in the output signal of the adder 11. When the converter 12 detects that an appreciable offset component remains in the output signal of the adder 11, the integrator 13 generates the offset cancel signal in response to the output signal of the converter 12. The adder 11 corrects the input signal in accordance with the offset cancel signal so that the remaining offset component can be removed from the output signal of the offset reducer.

The offset reducer of FIG. 1 is advantageous over the prior art circuit of Japanese application 64-4111 in that offset components can be removed from a digital signal of interest without adversely affecting low-frequency components of the digital signal of interest. Thus, the offset reducer of FIG. 1 is suited for use in digital audio signal processing circuits.

It should be noted that the embodiment of FIGS. 1 to 5 may be modified in various ways. For example, in a first modification, the selector 25 of FIG. 2 is omitted from the converter 12 and the signal B is continuously outputted from the converter 12. In a second modification, the signal received by the quantizer 21 (see FIG. 3) has bits, the number of which differs from four. In a third modification, only the highest bit (MSB) of the output signal of the adder 11 is processed by the quantizer 21. In a fourth modification, selected bits of an input signal are processed by the offset reducer. In a fifth modification, 8 higher bits of a 16-bit input signal are processed by the offset reducer. In a sixth modification: a first counter counts the number of past sampling periods during which the value represented by the output signal of the adder 11 is positive: a second counter counts the number of past sampling periods during which the value represented by the output signal of the adder 11 is negative; and a subtracter calculates the difference between the output signals of the first and second counters to derive the difference in length between the sum of past sampling periods during which the value represented by the output signal of the adder 11 is positive and the sum of past sampling periods during which the value represented by the output signal of the adder 11 is negative.

What is claimed is:

1. An offset reducer comprising:
    an adder for adding an input signal and an offset cancel signal to reduce an offset component of the input signal;
    a converter for measuring a difference between a sum of past periods during which an output signal of the adder was positive and a sum of past periods during which the output signal of the adder was negative, for outputting an offset detection signal of a given value which depends on a sign of the measured difference when an absolute value of the measured difference exceeds a given difference, and for initializing the measured difference to a given initial difference when the offset detection signal is outputted; and
    an integrator for accumulating the offset detection signal outputted from the converter, and for generating the offset cancel signal in accordance with a result of the accumulating the offset detection signal;
    wherein the output signal of the adder constitutes an offset-free signal corresponding to the input signal.

2. The offset reducer of claim 1, wherein the converter comprises means for deciding whether the output signal of the adder is positive or negative, and means for excluding a result of the deciding when the output signal of the adder is in a given range including zero.

* * * * *